(12) United States Patent
Kershaw

(10) Patent No.: US 7,057,184 B1
(45) Date of Patent: Jun. 6, 2006

(54) SCANNING ELECTRON MICROSCOPE

(75) Inventor: Matthew J. Kershaw, Nottingham (GB)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/528,034

(22) PCT Filed: Sep. 26, 2002

(86) PCT No.: PCT/GB02/04342

§ 371 (c)(1),
(2), (4) Date: Mar. 16, 2005

(87) PCT Pub. No.: WO2004/030018

PCT Pub. Date: Apr. 8, 2004

(51) Int. Cl.
*H01J 37/26* (2006.01)

(52) U.S. Cl. .................................. 250/443.1; 250/310

(58) Field of Classification Search ............. 250/443.1, 250/310
See application file for complete search history.

(56) References Cited

U.S. PATENT DOCUMENTS 4,705,949 A * 11/1987 Grimes et al. ......... 250/440.11
5,097,134 A    3/1992 Kimoto et al.
5,147,823 A * 9/1992 Ishibashi et al. ............ 438/694
6,025,592 A * 2/2000 Knowles et al. ............ 250/310

OTHER PUBLICATIONS

Patent Abstracts of Japan, Title; Environment Control Type Scanning-Type Electronic Microcope, applicant: Nikon, Inventor, Koga Yasunori, Application date: Feb. 27, 1997, Aplication No. 09043247, Publication No.: 10241620, Publication date: Nov. 9, 1998.

* cited by examiner

Primary Examiner—Kiet T. Nguyen
(74) Attorney, Agent, or Firm—Mark G. Bocchetti

(57) ABSTRACT

The invention provides a liquid injection system (12) for an environmental scanning electron microscope. The liquid injection system comprises a liquid firing device (18) for firing a liquid and a heat transfer system (17, 22, 24). The heat transfer system functions to maintain the liquid below its boiling point at an operating pressure within the specimen chamber of the environmental scanning electron microscope. The invention also provides an environmental scanning electron microscope incorporating a liquid injection system according to the present invention. The invention provides a simple and robust system for enabling investigation of the liquid injection system within an environmental or variable pressure scanning electron microscope.

15 Claims, 3 Drawing Sheets

SCANNING ELECTRON MICROSCOPE

FIELD OF THE INVENTION

The present invention relates to a scanning electron microscope and in particular to a variable pressure or environmental scanning electron microscope (ESEM). The invention also relates to a liquid injection system for use with an environmental scanning electron microscope.

BACKGROUND OF THE INVENTION

Conventional variable pressure or environmental scanning electron microscopes, typically include a specimen chamber for receiving a specimen to be viewed. The specimen chamber is arranged in communication with an electron column at one end of which an electron source is arranged to provide a beam of electrons for interaction with the specimen in the specimen chamber. One or more detectors are provided to monitor a variety of signals resulting from interaction between the specimen and electrons in the beam. An example of such an ESEM is the FEI Philips ESEM.

The primary advantage of an ESEM over a conventional scanning electron microscope is that it permits a user to vary the sample environment i.e. the environment within the specimen chamber through a range of pressures, temperatures and gas compositions. In other words, the high vacuum constraints required in the specimen chamber of a conventional scanning electron microscope are not required in the specimen chamber of an ESEM. Due to this and other well known differences between an ESEM and a conventional scanning electron microscope specimens may be examined in an ESEM in their natural states e.g. wet, dirty, non-conductive etc.

There are a number of applications in which it is desirable to introduce liquid drops into the specimen chamber of an ESEM with a liquid firing device such as an inkjet print head so that the interaction between a liquid drop and a receiving surface can be viewed. For example, in the printing industry, research is conducted into the mechanism by which inkjet printing operates. In general, currently available systems and methods for introducing liquid into the specimen chamber of an ESEM are too coarse in that the size of the drops formed are too large and they are difficult to control. One example of such a system is the microinjector made by Oxford Instruments. This system can be difficult to control because it relies on the use of a complex system of tubes and valves. Furthermore, it does not provide any way of viewing the operation of an inkjet print head and the printing process from an inkjet print head under the magnification available from a scanning electron microscope.

SUMMARY OF THE INVENTION

According to a first aspect of the present invention, there is provided a liquid injection system for an environmental scanning electron microscope. The liquid injection system comprises a liquid firing device such as an inkjet print head for firing a liquid and a heat transfer system for maintaining the liquid below its boiling point at an operating pressure within the specimen chamber of the environmental scanning electron microscope.

According to a second aspect of the present invention, there is provided an environmental scanning electron microscope. The microscope comprises an electron source to provide a beam of electrons and a specimen chamber for receiving a specimen to be viewed by the microscope. The microscope also includes a liquid injection system according to the first aspect of the present invention. The liquid injection system is controllable within the specimen chamber to fire liquid onto a specimen whilst the specimen is being viewed.

According to a further aspect of the present invention, there is provided a method of firing liquid from a liquid firing device such as an inkjet print head in an environmental scanning electron microscope. The method comprises the steps of:

providing, in the specimen chamber of the environmental scanning electron microscope, a liquid injection system according to the first aspect of the present invention;

monitoring the temperature of liquid in an associated liquid reservoir within the liquid firing device of the liquid injection system; and, adjusting the temperature of the liquid to maintain the temperature of the liquid below its boiling point at an operating pressure within the specimen chamber of the environmental scanning electron microscope.

In a preferred example of the present invention, the temperature of the liquid is adjusted automatically, in dependence on a control signal obtained from the liquid reservoir indicative of the temperature of the liquid.

ADVANTAGEOUS EFFECT OF THE INVENTION

The invention provides a simple and robust system for enabling investigation of a liquid injection system within an environmental or variable pressure scanning electron microscope. The use of a heat transfer system enables the temperature of a liquid within the specimen chamber of the environmental scanning electron microscope to be controlled so that it does not undergo any adverse changes in phase i.e. boiling or freezing. Thus, despite the low-pressure conditions within the specimen chamber of the microscope, accurate representations of the firing of the liquid by an inkjet print head may be achieved. In addition since an inkjet print head is used which typically fires drops having sizes of the order of magnitude of picolitres, the invention enables a user to investigate how a liquid such as water spreads on a receiving surface on a micrometer scale.

In one example, electrical contacts are fed from the inkjet print head through a port in the microscope. This enables remote control of the firing of the inkjet print head within the microscope specimen chamber.

In one example a fan is used as the heat transfer system to remove warmed air or gas from the vicinity of liquid within the inkjet print head. Surprisingly, despite the low pressure conditions within the specimen chamber and the consequent small amount of gas in the specimen chamber, the heat transfer system including the fan is effective at cooling the liquid.

BRIEF DESCRIPTION OF THE DRAWINGS

Examples of the present invention will now be described in detail with reference to the accompanying drawings, in which.

DETAILED DESCRIPTION

Figure 1:
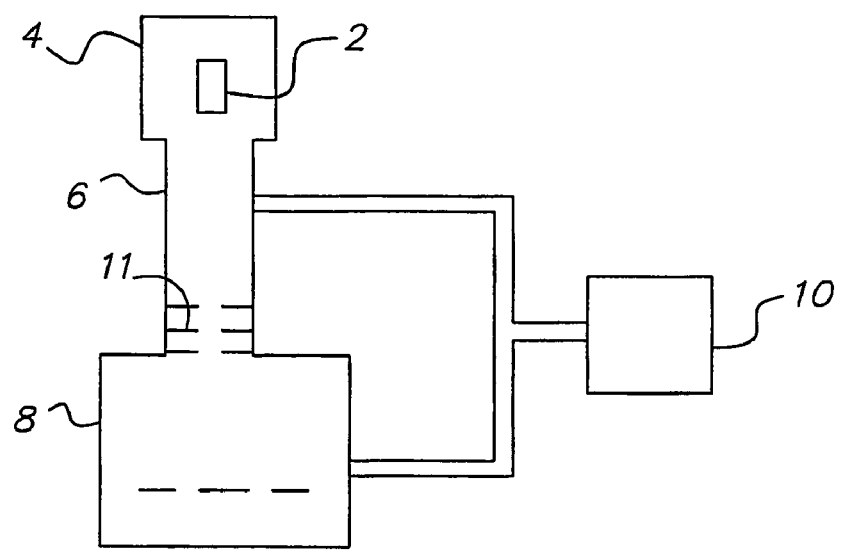
FIG. 1 shows a schematic representation of a first example of an environmental scanning electron microscope according to the present invention.

FIG. 1 shows a schematic representation of an environmental scanning electron microscope according to the present invention. The microscope comprises an electron source 2 housed within an electron gun chamber 4. An electron column 6 is provided to receive electrons from the electron source 2 and couple them to a specimen chamber 8. A vacuum source 10 is provided in communication with the electron column 6 and specimen chamber 8. This serves to ensure that the vacuum within the electron column 6 is maintained at a sufficiently high level e.g. up to between $10^{-5}$ Torr and $10^{-9}$ Torr. One or more pressure limiting apertures 11 (PLAs) are provided between the electron column 6 and the specimen chamber 8. The regions below, between and above the PLAs are separately pumped to provide a graduated vacuum from as low as 50 Torr in the specimen chamber to $10^{-5}$ Torr or higher in the column and gun.

A liquid injection system 12 including a liquid firing device such as an inkjet print head having a reservoir of liquid is provided in the specimen chamber of the microscope which, as will be explained below, enables the mechanism of inkjet printing to be viewed under SEM conditions. A specimen is also positioned in the specimen chamber of the microscope to receive liquid ejected from the liquid injection system 12. Any sort of liquid firing device that is suitable may be used in the liquid injection system 12 of the present invention. For example inkjet print heads such as those actuated thermally or by the piezoelectric effect may be used.

Although the ESEM allows imaging at vacuums far below (i.e. pressures far above) those employed by conventional scanning electron microscopes, the specimen chamber is still, in general at a pressure of around one hundredth atmospheric pressure (around five or six Torr/mm Hg). At these pressures, water will boil at around five degrees centigrade. Since the liquid within the reservoir of liquid is usually water or an aqueous solution, it is necessary to cool the liquid in the reservoir to prevent boiling and/or rapid evaporation. This is achieved in the present invention by providing a heat transfer system in association with the liquid firing device to ensure that the temperature of the liquid can be maintained within a predetermined or changeable range.

As will be explained below, in one example this may be achieved using a heat sink in the reservoir. The top of the heat sink is in contact with the cold side of a thermoelectric module such as a Peltier-type thermoelectric module. The hot side of the Peltier-type thermoelectric module is in contact with a second heat sink to allow the convection of heated atmospheric gas within the specimen chamber away from the thermoelectric module. The heat sink is in turn topped with a small fan which forces the dissipation of the generated hot gas. Usually, the gas is air and since the pressure within the specimen chamber is low, the amount of gas/air is small.

An example of the liquid injection system is shown in and will now be described with reference to FIG. 2. The liquid injection system 12 comprises a is mounting assembly 14 for positioning on the specimen stage 16 of the environmental scanning electron microscope. Preferably, the mounting assembly 14 is provided with guide channels 19 to enable alignment and reconfiguring of the assembly 14 on the specimen stage 16 of the environmental scanning electron microscope. In this example, an inkjet print head 18 is provided as the liquid firing device, coupled to the assembly 14. Any suitable liquid firing device may be used, inkjet print heads being a preferred example. It is preferred that the inkjet print head 18 is rotatably mounted relative to the assembly 14 such that it is rotatable about one or more axes of rotation to adopt any desired configuration when in use. The mounting assembly 14 functions as a holder for the liquid firing device and accordingly, optionally enables movement of the liquid firing device relative to the mounting assembly 14 and the sample stage 16 e.g. via one or more pivots (see FIG. 4).

A first heat sink 17 is provided in communication with the liquid reservoir of an inkjet print head 18. The first heat sink 17 is coupled to a thermoelectric module 20 which is itself in communication with a second heat sink 22 and a fan 24 to transfer excess heat away from the liquid reservoir and the liquid firing device. The fan 24 creates a current of gas to encourage transfer, via convection, of heat away from the second heat sink. Suprisingly, despite the low pressure conditions typical to the specimen chamber of an environmental scanning electron microscope, the second heat sink 22 and fan 24 function sufficiently well to maintain the temperature of liquid within the liquid reservoir within a predetermined range such that boiling of the liquid is avoided.

In combination, the first heat sink 17, thermoelectric module 20, second heat sink 22 and fan 24, function to transfer heat from the liquid reservoir to enable the inkjet print head 18 to operate in the environmental conditions e.g. pressure, temperature and humidity in the specimen chamber of the ESEM.

Figure 3:
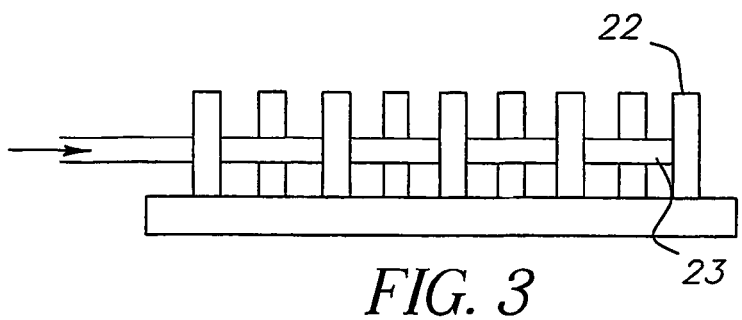
FIG. 3 shows a schematic representation of an example of a suitable heat transfer system for use in the liquid injection system of FIG. 2.

FIG. 3 shows a schematic representation of an alternative example of a suitable heat transfer system. In this example, conductive tubing 23 is arranged in communication with the second heat sink 22, or even in direct contact with the thermoelectric module 20. Cold water is pumped through the tubing 23 so that heat may be removed from the second heat sink 22 or thermoelectric module 20. The tubing 23 is made of a heat conducting material such as for example copper.

Figure 2:
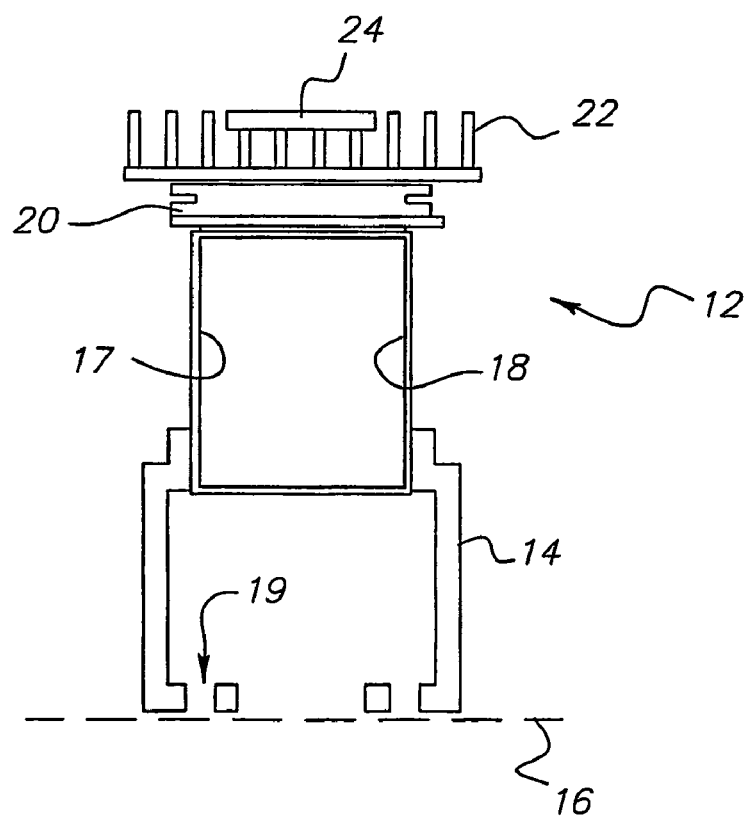
FIG. 2 shows a liquid injection system according to the present invention for an environmental scanning electron microscope.
Figure 4:
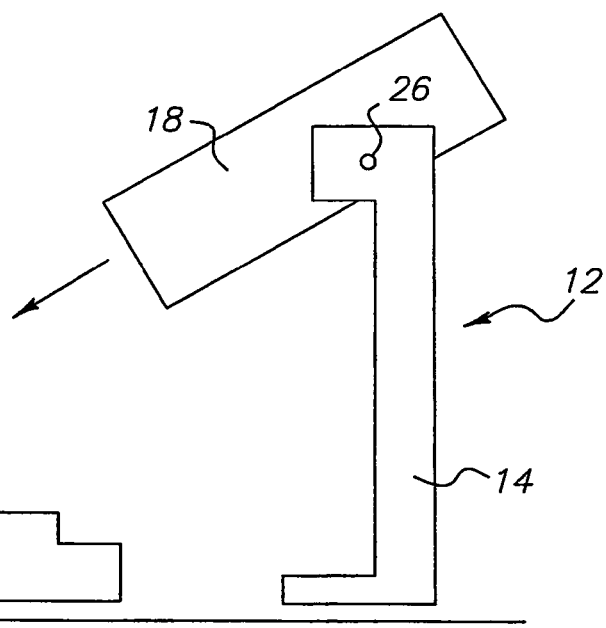
FIG. 4 shows a schematic representation of a section through a liquid injection system of FIG. 2.

FIG. 4 shows a schematic representation of a section through the liquid injection system of FIG. 2. The inkjet print head 18 is arranged on a pivot 26 that enables the direction of printing to be controlled. Optionally a control system may be used to enable remote control of the direction in which the print head points. This enables the angle of incidence of fired liquid onto the specimen to be controlled.

In use, a specimen is positioned on the specimen stage 16 of the microscope and a liquid is then fired (or printed) from the print head 18 onto the specimen. Prior to printing on the specimen, the environmental conditions within the specimen chamber are determined and fixed. For example, the pressure within the chamber is controlled by conventional ESEM controls. Other environmental conditions are similarly controlled. Since pressure within the specimen chamber is so low, the boiling point of most liquids that might be used is correspondingly low. Accordingly, it is essential that the liquid within the reservoir is maintained at a sufficiently low temperature so that it does not boil within the low-pressure atmosphere. The present invention provides a system by which the temperature of the liquid being fired by the liquid firing device e.g. liquid within the liquid reservoir may be maintained sufficiently low such that boiling does not occur. As will be explained below a temperature sensor is used to monitor the temperature of the liquid. This may be used to provide a signal to an automated feedback system to control the temperature of the liquid.

In one example, a temperature sensor is arranged in communication with the liquid and is configured to provide a control signal. The control signal is received by a control system which in turn controls the operation of the heat transfer system described above, to ensure that the liquid remains below its boiling point at low pressure.

Figure 5:
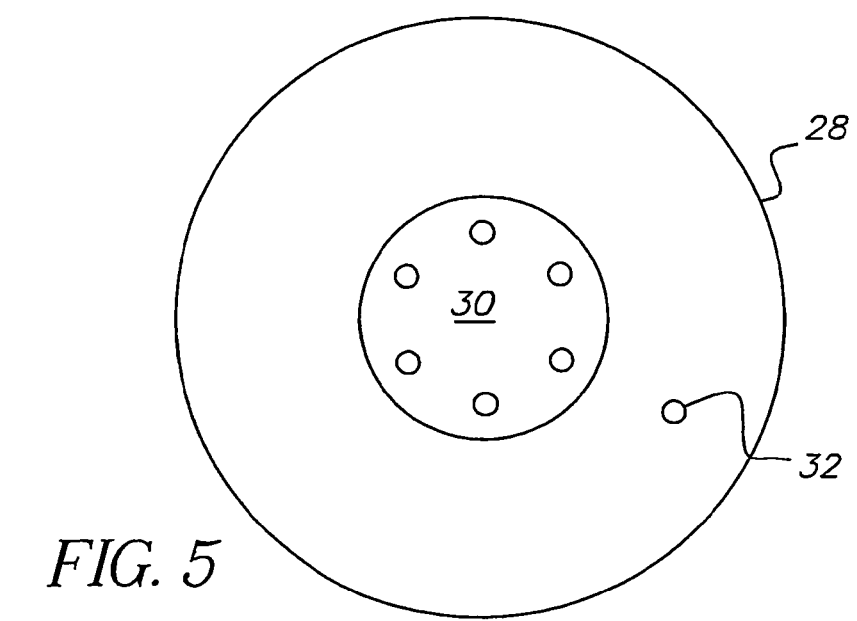
FIG. 5 shows a schematic representation of a feed-through for use with the liquid injection system of FIG. 2; and, FIG. 6 shows a schematic representation of the specimen chamber of a second example of an environmental scanning electron microscope according to the present invention.

In order to supply power to the print-head, thermoelectric module and fan it is necessary to introduce six electrical contacts into the specimen chamber of the ESEM. In one example of the present invention a six-contact electrical vacuum feed-through is used. The feed-through, may be mounted in a blanking plate designed to fit an existing port on the ESEM. FIG. 5 shows a schematic representation of a feed-through for use with the liquid injection system of FIG. 2. The feed-through comprises a cover-plate 28 having formed therein an opening 30 for allowing the passage of electrical supply wires (not shown) into the specimen chamber. Usually, the electrical supply wires are bound into a single cable. The cable that passes through or connects to the opening 30 is vacuum-sealed with the cover-plate 28, which itself is provided with a vacuum seal around its outer perimeter for ensuring an airtight seal between the plate 28 and the port within the specimen chamber when the plate 28 is in position in the microscope.

The electrical supply wires (not shown) each have a contact for connection to a selected component of the liquid injection system. The cover-plate 28 is also provided with a hole 32 adapted to allow the insertion of a thermocouple into the specimen chamber and/or the liquid reservoir. This enables temperature of water in the water reservoir to be monitored. The monitoring of temperature is critical because freezing the water in the print-head causes a failure in the firing mechanism of the print head. Boiling of the water is similarly undesirable.

In one example of the present invention, an inkjet print-head was used (as the liquid firing device) that had been removed from a Hewlett-Packard Thinkjet™ printer. Remote firing of the print head in the ESEM specimen chamber was performed and the technique thus developed was adapted for a picolitre injector. A print-head assembly was mounted in a holder as shown in FIGS. 2 and 4, which allowed the fixing of the print-head on to the ESEM sample stage 16. The print-head assembly was mounted to allow horizontal, vertical and rotational motion of the print-head assembly.

In this example, interaction between water and a receiving specimen was investigated. Thus, modification of the commercially available inkjet print-head and associated ink cartridge was required. The modification involved the removal of an elastic sac, which normally holds the ink, from within the commercially available ink cartridge. The resultant cavity in the cartridge was filled with water.

Any suitable liquid may be used in the inkjet print head 16. For example, if the adsorption of ink onto an inkjet receiver is being investigated, a specimen of inkjet receiver is positioned on the microscope specimen stage and ink from a conventional inkjet print cartridge is used. In this case no modification of the inkjet print head is required. There are many other applications for liquid injection system and microscope of the present invention. Any type of liquid of may be used in the print head 16 so long as its physical limitations are suitable for use within the print head. Typically the physical limitations include the boiling point, viscosity and surface tension of the liquid. The closer the physical parameters of a liquid are to those of ink, the easier it is to fire it in the system of the present invention. Ink is typically 60% by weight water and the remaining constituents are components such as dyes, surfactants and humectants selected to control the physical characteristics of the liquid.

In some cases it might be that oils are used instead of inks or water. For example, if the relationship between oil and a surface is investigated a sample of the surface is used as the specimen and the print head is supplied with oil. Alternatively it is useful to petroleum or petrochemical engineers to understand the process by which water wets oil-bearing rocks. Chemists are interested in the way acids or bases corrode surfaces on which they are received. The present invention provides a method by which the interaction between an acid or a base and a receiving surface can be investigated. It will be appreciated that the present invention has uses in any application where the interaction between a liquid and a receiving surface are investigated.

Figure 6:
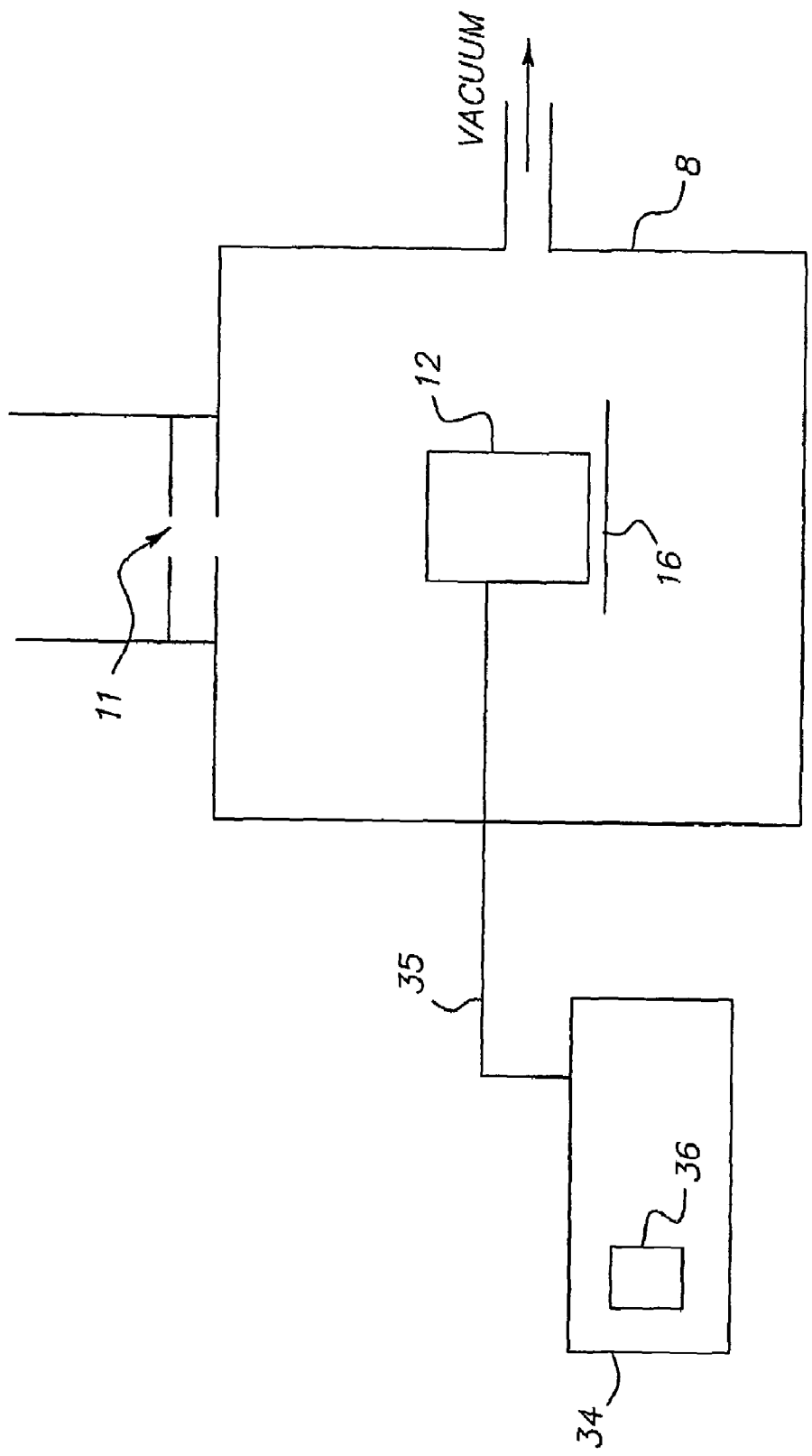

FIG. 6 shows a schematic representation of the specimen chamber 8 of a second example of an environmental scanning electron microscope according to the present invention. A sample stage 16 is provided having a liquid injection system (shown schematically) 12 as shown in and described with reference to FIG. 2, supported thereon.

A power supply and control unit 34 is provided to supply power to the components within the liquid injection system. A connector 35 is provided between the power supply and control unit 34 and liquid injection system 12 as described above with reference to FIG. 5. The power supply and control unit 34 is provided with electronic control circuitry to provide a suitable electronic signal to the inkjet print head 18 within the liquid injection system 12. This might be a DC spike or pulsed signal to simulate a print signal that the inkjet print head 18 is ordinarily configured to receive from a conventional inkjet printer control system. The power supply and control unit 34 is also provided with power supply sources for the thermocouple 20 and any orientation controls associated with the inkjet print head to control the direction and/or orientation in which it fires liquid.

It will be appreciated that although shown schematically as a single unit 34, the power supply and control unit 34 may comprise separate control and/or power supply units for each of the components of the liquid injection system 12 and or the environmental scanning electron microscope. Indeed the control unit may comprise one or more application specific integrated circuits or it may be a suitably programmed computer.

The invention claimed is:

1. A liquid injection system for an environmental scanning electron microscope, the liquid injection system comprising:
 a liquid firing device for firing a liquid; and,
 a heat transfer system for maintaining the liquid below its boiling point at an operating pressure within a specimen chamber of the environmental scanning electron microscope.

2. A liquid injection system according to claim 1, in which the liquid firing device is an inkjet print head.

3. A liquid injection system according to claim 1, in which the liquid firing device comprises a liquid reservoir.

4. A liquid injection system according to claim 3, in which heat transfer system comprises a first heat sink arranged at least partially within the liquid reservoir; and, a thermoelectric module which when in use has a cold side and a hot side, the cold side of which is in communication with the first heat sink.

5. A liquid injection system according to claim 4, in which the heat transfer system comprises a second heat sink in communication with the hot side of the thermoelectric module.

6. A liquid injection system according to claim 5, in which the heat transfer system further comprises a fan to generate a gas flow to transfer heat from the second heat sink to the surrounding atmosphere.

7. A liquid injection system according to claim 5, in which the heat transfer system comprises a conductive heat transfer unit in communication with the thermoelectric module.

8. A liquid injection system according to claim 7, in which the conductive heat transfer unit is in communication with the thermoelectric module via elements of the second heat sink.

9. A liquid injection system according to claim 7, in which the conductive heat transfer unit is a member made of a conductive material the member being routed within the specimen chamber to contact the second heat sink to enable conduction of heat from the second heat sink to the member.

10. A liquid injection system according to claim 9, in which the member is a metal pipe having a current of liquid running therethrough such that as liquid passes through said pipe, it is warmed by heat received from the second heat sink.

11. A liquid injection system according to claim 1, comprising a liquid firing mechanism, the liquid firing mechanism being either a piezo electric firing system or a thermal firing system.

12. A liquid injection system according to claim 1, in which the liquid is selected from the group consisting of ink, water, oil or a suspension or solution comprising one or more of ink, water and oil.

13. An environmental scanning electron microscope, comprising:
   an electron source to provide a beam of electrons;
   a specimen chamber for receiving a specimen to be viewed by the microscope; and,
   a liquid injection system according to claim 1, the liquid injection system being controllable within the specimen chamber to fire liquid onto the specimen whilst the specimen is being viewed.

14. A method of firing a liquid firing device in an environmental scanning electron microscope, comprising the steps of;
   providing a liquid injection system according to claim 1 in the specimen chamber of the environmental scanning electron microscope;
   monitoring the temperature of liquid in an associated liquid reservoir within the liquid firing device;
   adjusting the temperature of the liquid to maintain the temperature of the liquid below its boiling point at an operating pressure within the specimen chamber of the environmental scanning electron microscope.

15. A method according to claim 14, in which the temperature of the liquid is adjusted automatically, in dependence on a control signal obtained from the liquid reservoir the signal being indicative of the temperature of the liquid.

* * * * *